United States Patent
Bienek et al.

(10) Patent No.: US 7,289,779 B2
(45) Date of Patent: Oct. 30, 2007

(54) METHOD FOR CALIBRATING THE FREQUENCY OF AN RF OSCILLATOR IN A MOBILE PART OF A MOBILE COMMUNICATIONS DEVICE

(75) Inventors: Bernd Bienek, Bocholt (DE); Andreas Falkenberg, Escondido, CA (US); Stephan Karger, Hamminkeln (DE); Theo Kreul, Coesfeld-Lette (DE); Albrecht Kunz, Saarbrücken (DE); Holger Landenberger, Bocholt (DE)

(73) Assignee: Siemens Aktiengesellschaft, Munich (DE)

( * ) Notice: Subject to any disclaimer, the term of this patent is extended or adjusted under 35 U.S.C. 154(b) by 636 days.

(21) Appl. No.: 10/381,014

(22) PCT Filed: Aug. 31, 2001

(86) PCT No.: PCT/DE01/03341

§ 371 (c)(1),
(2), (4) Date: Aug. 18, 2003

(87) PCT Pub. No.: WO02/25812

PCT Pub. Date: Mar. 28, 2002

(65) Prior Publication Data

US 2004/0043737 A1    Mar. 4, 2004

(30) Foreign Application Priority Data

Sep. 20, 2000    (DE) .............................. 100 46 574

(51) Int. Cl.
*H03J 7/32*    (2006.01)

(52) U.S. Cl. ....................................... 455/147; 375/343

(58) Field of Classification Search .................. 455/75, 455/87, 147, 150.1, 154.1, 158.1, 161.1, 455/183.1, 184.1, 196.1, 208, 265; 375/343, 375/340

See application file for complete search history.

(56) References Cited

U.S. PATENT DOCUMENTS 5,276,706 A * 1/1994 Critchlow .................... 375/343

(Continued)

FOREIGN PATENT DOCUMENTS

DE    25 42 614    3/1977

(Continued)

*Primary Examiner*—Edward F. Urban
*Assistant Examiner*—Tu X. Nguyen
(74) *Attorney, Agent, or Firm*—Bell, Boyd & Lloyd LLP

(57) ABSTRACT

A method is provided for calibrating the frequency of an RF oscillator in a mobile part of a mobile communications device when the mobile part is first switched on, wherein the method includes the steps of: sampling a modulated carrier that is transmitted by a base station and has a prescribed frequency accuracy, such that scanning of the modulated carrier is performed via a frequency search algorithm with the modulated carrier being demodulated, a signal thus demodulated being compared in an evaluation and synchronization program via a correlation with a sequence known in advance, and a correlation peak in an output of the correlator being determined; determining a frequency error between the frequency of the RF oscillator in the mobile part of the mobile communications device and a known channel frequency of the base station by comparing the determined correlation peak of the output of the correlator with a channel raster, known in advance to the mobile communications device, of the base station; synchronizing the mobile communications device with the modulated carrier; and adopting a frequency, corrected by the frequency error, for the RF oscillator as reference frequency for further calibration operations.

6 Claims, 2 Drawing Sheets

U.S. PATENT DOCUMENTS 5,649,320 A * 7/1997 Korhonen et al. ....... 455/196.1
6,256,497 B1 * 7/2001 Chambers ................... 455/433
6,625,200 B1 * 9/2003 Dent .......................... 375/142

FOREIGN PATENT DOCUMENTS

| DE | 39 16749 | 11/1990 |
| DE | 195 16 449 | 11/1996 |
| DE | 197 30 521 | 2/1998 |
| DE | 197 37 758 | 3/1999 |
| DE | 199 33 542 A1 * | 1/2001 |
| EP | 0 720 298 | 7/1996 |
| EP | 0 735 675 | 10/1996 |
| EP | 0 845 860 | 6/1998 |
| EP | 0 845 860 A1 * | 6/1998 |

* cited by examiner

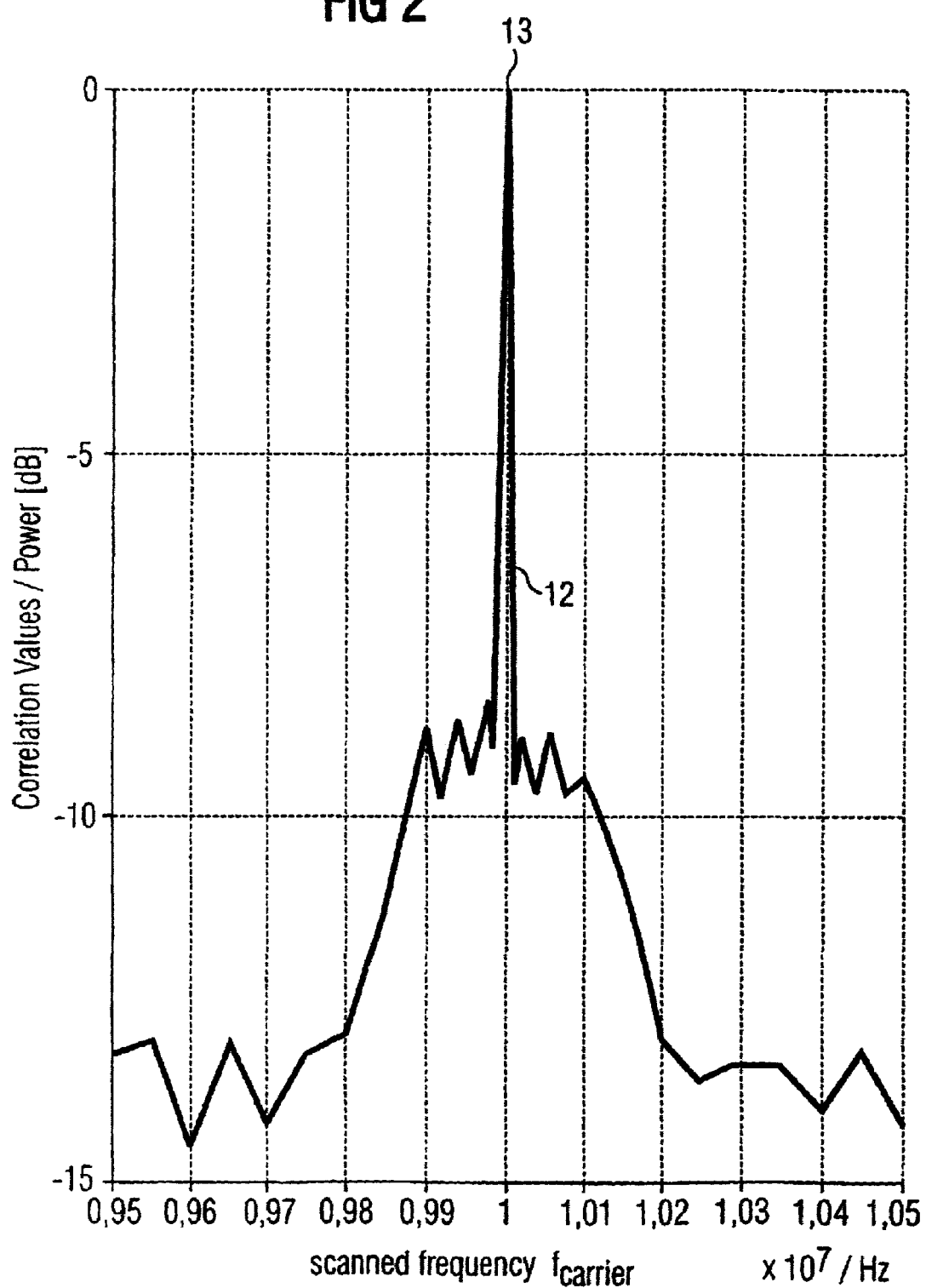

METHOD FOR CALIBRATING THE FREQUENCY OF AN RF OSCILLATOR IN A MOBILE PART OF A MOBILE COMMUNICATIONS DEVICE

BACKGROUND OF THE INVENTION

The present invention relates to a method for calibrating the frequency of an RF oscillator in a mobile part of a mobile communications device when the mobile part of the mobile communications device is first switched on, having the following steps: sampling a modulated carrier that is transmitted by a base station and has a prescribed frequency accuracy; determining the frequency error between the frequency of the RF oscillator in the mobile part of the mobile communications device and a known channel frequency of the base station; and synchronizing of the mobile communications device with the modulated carrier.

Such a method is disclosed in EP 0 735 675 A2, the determination of the sequence error being performed successively by virtue of the fact that the search range for the frequency of the base station is expanded until the frequency of the base station is found. The channel frequency of the base station is certainly fundamental, but not known on the part of the mobile communications device.

Depending on the transmission method, the field of mobile communication is generally covered by a certain standard that requires a prescribed frequency accuracy for a base station of a communications device during transmission and prescribes a frequency accuracy for the case of reception in the mobile receiver part via further system properties.

This standard has been ensured to date by calibrating the RF oscillator during fabrication of the mobile part of a mobile communications device. However, calibration in fabrication is very expensive and requires a long production time.

It also has been proposed, for the purpose of correcting the temperature dependence of an RF oscillator in a mobile part of a mobile communications device, to make use of a temperature sensor that compensates the temperature-dependent error of the RF oscillator in conjunction with an appropriate algorithm. This method is also very expensive.

It is, therefore, an object of the present invention to propose a method by which the production costs for a mobile communications device are lowered and, at the same time, a reliable calibration of the frequency of the RF oscillator of the mobile part of the mobile communications device is ensured.

SUMMARY OF THE INVENTION

The present invention is based on the fundamental idea that the calibration of the RF oscillator can be performed by the customer when a mobile receiver is switched on for the first time. Use is made for this purpose of the accuracy of the transmit frequency of a base station, which accuracy is specified with sufficiently high accuracy and by standardization bodies. The transmitted carrier, with information modulated thereon, which is transmitted by the base station, is scanned in the mobile receive section. If the transmitted carrier, whose frequency is known a priori with high accuracy through the channel raster, is received, with the information modulated thereon, with a satisfactory frequency accuracy, the frequency error can be determined and the mobile part of the mobile communications device can be synchronized with the carrier. The frequency corrected by the frequency error is then used as reference frequency.

Instead of the initial calibration during the production process of the mobile part, the required settings are undertaken during the first startup via the frequency search algorithm. The calibration is therefore performed fully automatically.

It is advantageous to carry out the method according to the present invention repeatedly; in particular, with each xth callup, starting in each case from the reference frequency last determined. It is then possible to assume a smaller frequency deviation of the RF oscillator in these later synchronization operations. As a rule, the method according to the present invention is not carried out again immediately, since it may be assumed that the RF oscillator has been effectively calibrated by the previous initial autocalibration. The dummy x is a function, inter alia, of temperature fluctuations in the surroundings of the oscillator, and of its age. Consequently, the dummy x certainly can be 1, but is not constrained to be so. The future synchronization is thereby accelerated. Moreover, the accuracy is increased by averaging a number of measurements. In addition, the speed of the synchronization is increased by virtue of the fact that only a relatively small frequency band has to be scanned. The power consumption in the mobile part is reduced by a quicker synchronization, and this leads to a longer period of use. It is thereby possible, in addition, to recalibrate aging effects and temperature deviations of the components that are required for frequency generation. This can take place, for example, with each xth callup and, consequently, it does not cause any additional outlay. The recalibration also substantially lengthens the product service life without additional outlay.

It is also advantageous when use is made during the first synchronization of a transmitted signal of an arbitrary base station of sufficient accuracy, but the subsequent callup is performed on a carrier of another base station of sufficient accuracy. This signal can have a better signal-to-noise ratio, and can deliver a higher frequency accuracy as well as a shorter synchronization time. For example, it is possible in the case of the UMTS method to make use of each of the possible channels of the UMTS network for autocalibration. It is thereby possible to synchronize with an arbitrary channel of a specific base station of an operating company. The subsequent callup can then take place on an arbitrary channel, including another one with another operating company. It is likewise possible to carry out the synchronization and the callup with the same base station when the latter is the most suitable one at the time.

Furthermore, in the case of a further embodiment of the present invention, a single multimode mobile part can be used for synchronizing the mobile communications device with mutually synchronized base stations of different standards. This leads to a synchronization that is simple, fast and versatile. Moreover, many different standards can be interconnected thereby.

Furthermore, it is advantageous when the calibration additionally takes place over the temperature range, for which purpose a temperature measurement is combined with the frequency search algorithm. Such a calibration over the temperature would be particularly time-consuming and cost-intensive to produce. Owing to the continuous variation of the surroundings of the mobile part, a constant and optimum adaptation to the current circumstances can be performed by such a calibration during the frequency acquisition.

Additional features and advantages of the present invention are described in, and will be apparent from, the following Detailed Description of the Invention and the Figures.

BRIEF DESCRIPTION OF THE FIGURES

FIG. 2 shows a simulation result from the method illustrated in FIG. 1.

DETAILED DESCRIPTION OF THE INVENTION

Figure 1:
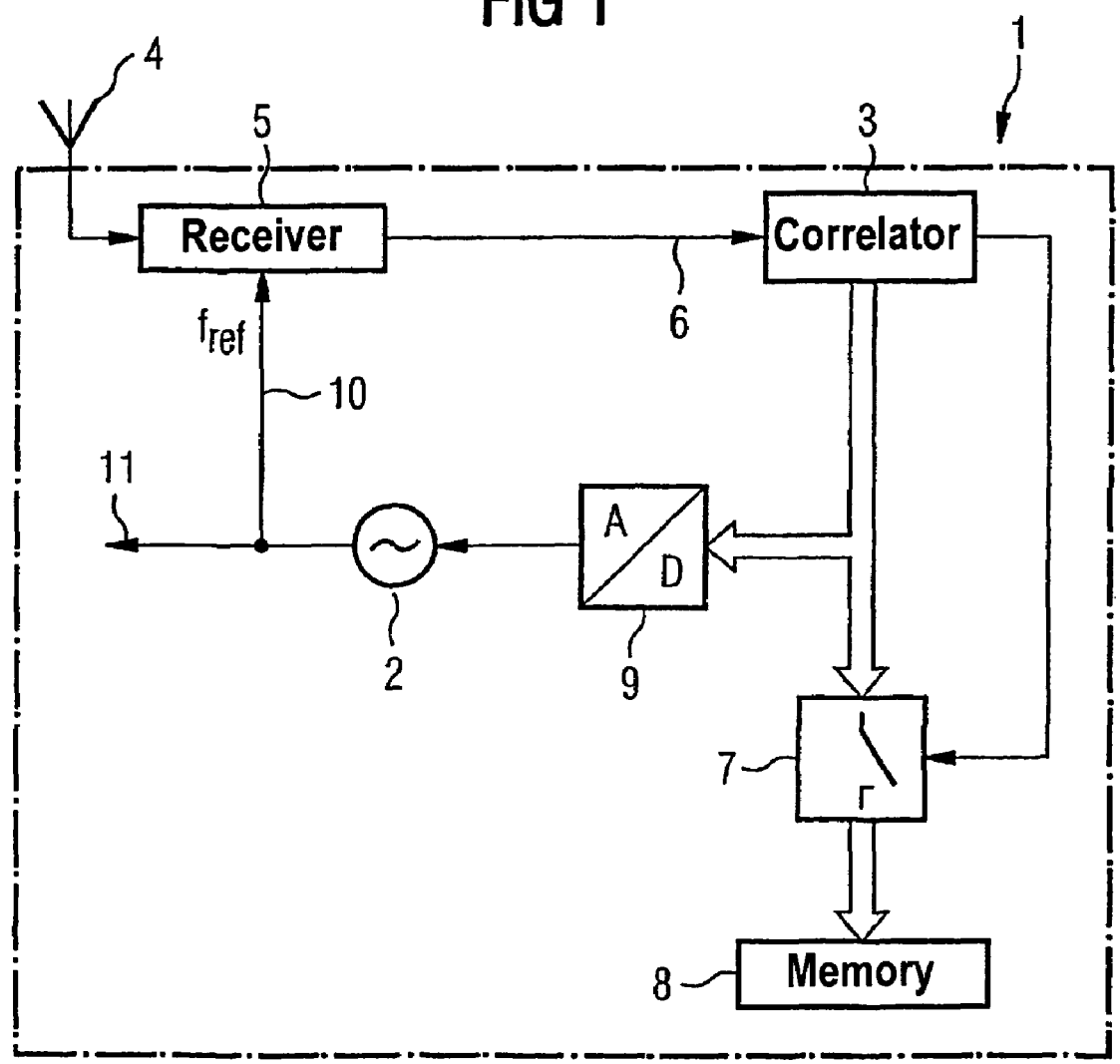
FIG. 1 shows a systematic illustration of a method according to the present invention.

The method illustrated in FIG. 1 is explained by way of example with the aid of an application in the UMTS Standard. Synchronization to an accuracy of +/−3 ppm with regard to the carrier frequency used is required in UMTS, in order to be able to undertake subsequent temporal synchronization. An RF oscillator of a production series has on average a component scatter of typically +/−25 ppm in the natural frequency. This is then reduced to a natural frequency scatter of +/−3 ppm by the autofrequency calibration described below. A mobile part 1 of a mobile communications device receives a signal 4, transmitted by a base station (not illustrated) in a receiver 5. The transmitted signal 4 is from the baseband of the base station, which is arranged around approximately 2. 1 GHz. The received signal 4 is demodulated in a known manner, and the signal 6 thus demodulated is compared in an evaluation and synchronization program 3 via a correlator with the pSCH sequence, which is already known in advance and uniform throughout the network. In this case, pSCH stands for Primary Synchronization Channel in accordance with the UMTS Standard.

FIG. 2 shows the output 12 of the correlator in the baseband, the frequencies illustrated being reduced by the center carrier frequency of the base station. A correlation peak 13 is formed at a frequency of 10 MHz. The mobile station in which channel raster the base station is transmitting is known a priori. At the base station end, the carrier frequency can support radio signals such as, for example, DCF77 or GPS with an accuracy that is still below that of the specification of the UTMS Standard of 0. 05 ppm. The deviation of the RF oscillator 2 of the mobile station 1 can be determined from the comparison of the known channel frequency of the base station with the measured correlation peak 13 of the output 12 of FIG. 2. The data for the autocalibration are obtained therefrom. The production-induced scatters in the natural oscillator frequency of the RF oscillator 2 of +/−25 ppm thereby can be compensated to the extent that it is possible to assume a maximum deviation of +/−3 ppm for future synchronization operations. Future synchronization processes are substantially accelerated thereby. This saves time and reduces the energy required for calibration, something which reduces the power consumption and thereby permits longer standby times of the mobile part.

Digital settings are obtained via the step, illustrated in FIG. 1, of the comparison in the evaluation and synchronization program 3. During a synchronization, the settings are passed on via a switch 7 to a memory 8 in which these are stored. The digital settings are also passed on to a digital-to-analog converter 9. The latter passes on the analog signal, which corresponds to the digital settings, to the voltage-controlled RF oscillator 2. On the one hand, the digital settings are passed on to further modules 11 and, on the other hand, they are passed on as new reference frequency $f_{ref}$ to the receiver 5 via a line 10.

On the occasion of the next calibration, this new reference frequency $f_{ref}$ serves as reference signal for the signal 4 then received, which is transmitted by the base station. A new calibration is undertaken using the steps set forth above after the demodulation of the demodulated received signal 6, passed on by the receiver 5, in relation to the evaluation and synchronization program 3. In which case, the synchronization can be performed more quickly, since the current reference frequency $f_{ref}$ is affected by a smaller scattering value.

Although the present invention has been described with reference to specific embodiments, those of skill in the art will recognize that changes may be made thereto without departing from the spirit and scope of the present invention as set forth in the hereafter appended claims.

The invention claimed is:

1. A method for calibrating a frequency of an RF oscillator in a mobile part of a mobile communications device when the mobile part is first switched on, the method comprising the steps of:

sampling a modulated carrier that is transmitted by a base station and has a prescribed frequency accuracy, wherein a scanning of the modulated carrier is performed via a frequency search algorithm with the modulated carrier being demodulated, a signal thus demodulated being compared in an evaluation and synchronization program via a correlator with a sequence known in advance, and a correlation peak in an output of the correlator being determined;

determining a frequency error between the frequency of the RF oscillator in the mobile part of the mobile communications device and a known channel frequency of the base station by comparing the determined correlation peak of the output of the correlator with a channel raster, known in advance to the mobile communications device, of the base station;

synchronizing the mobile communications device with the modulated carrier; and adopting a frequency, corrected by the frequency error, for the RF oscillator as reference frequency for further calibration operations.

2. A method for calibrating a frequency of an RF oscillator in a mobile part of a mobile communications device as claimed in claim 1, wherein the method is carried out under a UMTS Standard, with the sequence being a pSCH sequence uniform throughout an associated network.

3. A method for calibrating a frequency of an RF oscillator in a mobile part of a mobile communications device as claimed in claim 1, wherein the method is carried out repeatedly, starting out from the respective reference frequency last determined.

4. A method for calibrating a frequency of an RF oscillator in a mobile part of a mobile communications device as claimed in claim 1, wherein, for a first synchronization of a transmitted signal, use is made of an arbitrary base station and, for a subsequent callup, use is made of a carrier of another base station.

5. A method for calibrating a frequency of an RF oscillator in a mobile part of a mobile communications device as claimed in claim 4, wherein a single multi-mobile part is used for synchronizing the mobile communications device with mutually synchronized base stations of different standards.

6. A method for calibrating a frequency of an RF oscillator in a mobile part of a mobile communications device as claimed in claim 1, the method further comprising the step of performing a calibration over a temperature range via a temperature measurement.

* * * * *